(12) United States Patent
Adam et al.

(10) Patent No.: US 9,236,463 B2
(45) Date of Patent: Jan. 12, 2016

(54) COMPRESSIVE STRAINED III-V COMPLEMENTARY METAL OXIDE SEMICONDUCTOR (CMOS) DEVICE

(71) Applicant: GLOBALFOUNDRIES INC., Grand Cayman (KY)

(72) Inventors: Thomas N. Adam, Slingerlands, NY (US); Kangguo Cheng, Schenectady, NY (US); Bruce B. Doris, Brewster, NY (US); Pouya Hashemi, White Plains, NY (US); Ali Khakifirooz, Mountain View, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/027,563

(22) Filed: Sep. 16, 2013

(65) Prior Publication Data

US 2014/0191287 A1     Jul. 10, 2014

Related U.S. Application Data

(63) Continuation of application No. 13/736,183, filed on Jan. 8, 2013, now Pat. No. 9,006,789.

(51) Int. Cl.
*H01L 29/778*     (2006.01)
*H01L 29/423*     (2006.01)
(Continued)

(52) U.S. Cl.
CPC .......... *H01L 29/778* (2013.01); *H01L 21/8252* (2013.01); *H01L 21/8258* (2013.01); *H01L 21/845* (2013.01); *H01L 27/0605* (2013.01);
(Continued)

(58) Field of Classification Search
CPC .............. H01L 29/2003; H01L 29/778; H01L 29/7787; H01L 29/66462; H01L 29/66431
USPC ....................... 257/194, 369, 347, 43, E27.112
See application file for complete search history.

(56) References Cited

U.S. PATENT DOCUMENTS

| 4,665,415 A | * | 5/1987 | Esaki et al. ................. 257/190 |
| 5,396,082 A | | 3/1995 | Wada et al. |

(Continued)

OTHER PUBLICATIONS

U.S. Office Action dated Jan. 16, 2014 received in parent U.S. Patent Application, namely U.S. Appl. No. 13/736,183.

(Continued)

*Primary Examiner* — Chuong A Luu
*Assistant Examiner* — Rodolfo Fortich
(74) *Attorney, Agent, or Firm* — Scully, Scott, Murphy & Presser, P.C.

(57) ABSTRACT

A semiconductor device including a first lattice dimension III-V semiconductor layer present on a semiconductor substrate, and a second lattice dimension III-V semiconductor layer that present on the first lattice dimension III-V semiconductor layer, wherein the second lattice dimension III-V semiconductor layer has a greater lattice dimension than the first lattice dimension III-V semiconductor layer, and the second lattice dimension III-V semiconductor layer has a compressive strain present therein. A gate structure is present on a channel portion of the second lattice dimension III-V semiconductor layer, wherein the channel portion of second lattice dimension III-V semiconductor layer has the compressive strain. A source region and a drain region are present on opposing sides of the channel portion of the second lattice dimension III-V semiconductor layer.

12 Claims, 2 Drawing Sheets

(51) Int. Cl.
*H01L 29/66* (2006.01)
*H01L 21/8252* (2006.01)
*H01L 21/8258* (2006.01)
*H01L 21/84* (2006.01)
*H01L 27/06* (2006.01)
*H01L 27/12* (2006.01)
*H01L 29/10* (2006.01)
*H01L 29/205* (2006.01)
*H01L 29/20* (2006.01)
*H01L 29/51* (2006.01)

(52) U.S. Cl.
CPC ........ *H01L 27/1211* (2013.01); *H01L 29/1054* (2013.01); *H01L 29/205* (2013.01); *H01L 29/4232* (2013.01); *H01L 29/66462* (2013.01); *H01L 29/7787* (2013.01); *H01L 29/20* (2013.01); *H01L 29/51* (2013.01); *H01L 29/518* (2013.01)

(56) References Cited

U.S. PATENT DOCUMENTS

| | | | |
|---|---|---|---|
| 7,825,400 B2 | 11/2010 | Datta et al. | |
| 7,868,318 B2 | 1/2011 | Hudait et al. | |
| 7,947,971 B2 | 5/2011 | Majhi et al. | |
| 2005/0230672 A1 | 10/2005 | Kurihara et al. | |
| 2007/0284613 A1* | 12/2007 | Chui et al. | 257/192 |
| 2010/0193771 A1* | 8/2010 | Majhi et al. | 257/24 |
| 2010/0270591 A1 | 10/2010 | Ahn | |
| 2010/0327316 A1 | 12/2010 | Pourtois et al. | |
| 2011/0147706 A1 | 6/2011 | Radosavljevic et al. | |
| 2011/0180846 A1* | 7/2011 | Lin et al. | 257/190 |

OTHER PUBLICATIONS

Xia, L., et al., "Experimental Study of <100> Uniaxial Stress Effects on P-channel GaAs Quantum-Well FETs." IEEE Transactions on Electron Devices, Aug. 2011, vol. 58, No. 8, pp. 2597-2603.

Paul, A., et al., "Performance enhancement of GaAs UTB pFETs by strain, orientation and body thickness engineering," 2011 69th Annual Device Research Conference (DRC), Jun. 20-22, 2011, pp. 233-234.

Leite, M. S., et al., "Wafer-Scale Strain Engineering of Ultrathin Semiconductor Crystalline Layers," Advanced Materials, Sep. 2011, vol. 23, Issue 33, pp. 3801-3807.

* cited by examiner

US 9,236,463 B2

COMPRESSIVE STRAINED III-V COMPLEMENTARY METAL OXIDE SEMICONDUCTOR (CMOS) DEVICE

CROSS REFERENCE TO RELATED APPLICATION

This application is a continuation of U.S. patent application Ser. No. 13/736,183, filed Jan. 8, 2013 the entire content and disclosure of which is incorporated herein by reference.

BACKGROUND

The present disclosure relates to semiconductor structures and methods of fabricating the same. More particularly, the present disclosure relates to III-V compound semiconductor devices and methods of forming III-V compound semiconductor devices.

Silicon technology has dominated modern semiconductor devices as the mainstream technology for industry. In order to sustain Moore's Law, transistor dimensions are shrinking to achieve ever increasing density. Over the past several years, the inherent scaling limitations of electron devices have fueled the exploration of high carrier mobility semiconductors as a silicon (Si) replacement to further enhance the device performance. In particular, compound semiconductors heterogeneously integrated on Si substrates have been actively studied, combining the high mobility and low power consumption of III-V semiconductors and the well-established, low cost processing of the Si technology.

SUMMARY

In one embodiment, a method of forming a semiconductor device is provided that includes forming a first III-V semiconductor layer on a semiconductor substrate, and forming a second III-V semiconductor layer on the first III-V semiconductor layer. The second III-V semiconductor layer has a greater lattice dimension than the first III-V semiconductor layer, wherein a compressive strain is formed in the second III-V semiconductor layer. A p-type semiconductor device is then formed on the second III-V semiconductor layer having the compressive strain.

In another aspect, a semiconductor device is provided that includes a first lattice dimension III-V semiconductor layer that is present on a semiconductor substrate, and a second lattice dimension III-V semiconductor layer that is present on the first lattice dimension III-V semiconductor layer, wherein the second lattice dimension III-V semiconductor layer has a greater lattice dimension than the first lattice dimension III-V semiconductor layer, and the second lattice dimension IIII-V semiconductor layer has a compressive strain present therein. A gate structure is present on a channel portion of the second lattice dimension III-V semiconductor layer, wherein the channel portion of second lattice dimension III-V semiconductor layer has the compressive strain.

In another embodiment, a method of forming a semiconductor device is provided that includes forming a first III-V semiconductor layer on a semiconductor substrate and forming a second III-V semiconductor layer on the first III-V semiconductor layer. The second III-V semiconductor layer has a greater lattice dimension than the first III-V semiconductor layer, wherein a compressive strain is formed in the second III-V semiconductor layer. A p-type semiconductor device is then formed on a first portion of the second III-V semiconductor layer having the compressive strain, and an n-type semiconductor device is formed on a second portion of the second III-V semiconductor layer.

In another aspect, a semiconductor device is provided that includes a first lattice dimension III-V semiconductor layer that is present on a semiconductor substrate, and a second lattice dimension III-V semiconductor layer that is present on the first lattice dimension III-V semiconductor layer, wherein the second lattice dimension III-V semiconductor layer has a greater lattice dimension than the first lattice dimension III-V semiconductor layer, and the second lattice dimension IIII-V semiconductor layer has a compressive strain present therein. A first gate structure for a p-type conductivity semiconductor device is present on a first channel portion of the second lattice dimension III-V semiconductor layer, wherein the first channel portion of second lattice dimension III-V semiconductor layer has the compressive strain. A second gate structure for an n-type conductivity semiconductor device is present on a second channel portion of the second lattice dimension III-V semiconductor layer.

DETAILED DESCRIPTION OF THE INVENTION

Figure 1A:
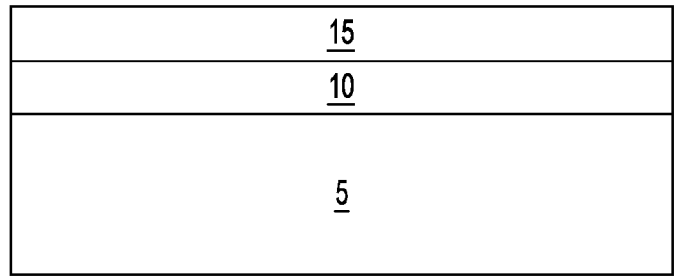
FIG. 1A is a side cross-sectional view depicting a first lattice dimension III-V semiconductor layer that is present on a semiconductor substrate, and a second lattice dimension III-V semiconductor layer that is present on the first lattice dimension III-V semiconductor layer, wherein the second lattice dimension III-V semiconductor layer has a greater lattice dimension than the first lattice dimension III-V semiconductor layer, and the second lattice dimension IIII-V semiconductor layer has a compressive strain present therein, in accordance with one embodiment of the present disclosure.

Detailed embodiments of the present disclosure are described herein; however, it is to be understood that the disclosed embodiments are merely illustrative of the compositions, structures and methods of the disclosure that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the compositions, structures and methods disclosed herein. Moreover, such phrases are not necessarily referring to the same embodiment. For purposes of the description hereinafter, the terms "upper", "lower", "vertical", "horizontal", "top", "bottom", and derivatives thereof shall relate to the invention, as it is oriented in the drawing figures.

The present disclosure relates to structures and methods for forming semiconductor devices including III-V semiconductor materials. The term "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. In the present disclosure, the term "III-V semiconductor material" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present disclosure include, but are not limited to alloys of InGaAs, InAlAs, InAlAsSb, InAlAsP and InGaAsP. III-V semiconductor materials are known for their superior electron mobility suitable for n-type semiconductor devices, such as n-type field effect transistors. However, the hole mobilities of III-V semiconductor materials are usually weaker, i.e., having a lesser hole mobility, therefore disadvantageously impacting the performance of p-type semiconductor devices. It has been determined that in some embodiments with compressive strain being introduced to III/V semiconductor materials, the hole mobility increases without significantly degrading the electron mobility of the n-type semiconductor devices.

FIGS. 1A-4 depict some embodiments of structures employed to provide a compressively strained III-V semiconductor material that is built-in globally to the channel of a p-type semiconductor device, which increases the carrier mobility, i.e., hole mobility, of the p-type semiconductor device. The carrier mobility, i.e., electron mobility, for n-type semiconductor devices is high in unstrained III-V semiconductor material and is negligibly influenced by compression.

FIG. 1A depicts one embodiment of a material stack that provides a compressively strained III-V semiconductor material that may be suitable to provide the channel portion of a p-type semiconductor device. The channel portion is the region of the semiconductor device between the source region and the drain region, and typically underlying a gate structure, that becomes conductive when the semiconductor device is turned on. The gate structure controls output current, i.e., flow of carriers in the channel portion of a semiconducting device, such as a field effect transistor, through electrical or magnetic fields.

In one embodiment, the material stack includes, from bottom to top, a semiconductor substrate 5, a first lattice dimension III-V semiconductor layer 10 that is present on the semiconductor substrate 5, and a second lattice dimension III-V semiconductor layer 15 that is present on the first lattice dimension III-V semiconductor layer 10, wherein the second lattice dimension III-V semiconductor layer 15 has a greater lattice dimension than the first lattice dimension III-V semiconductor layer 10, and the second lattice dimension IIII-V semiconductor layer 15 has a compressive strain present therein. In one embodiment, the first lattice dimension III-V semiconductor layer 10 is in direct contact with the semiconductor substrate 5, and the second lattice dimension III-V semiconductor material 15 is in direct contact with the first lattice dimension III-V semiconductor layer 10. The term "direct contact" means that a first element, such as a first structure, and a second element, such as a second structure, are connected without any intermediary conducting, insulating or semiconductor layers at the interface of the two elements.

The lattice dimensions of the first lattice dimension III-V semiconductor layer 10 and the second lattice dimension III-V semiconductor layer 15 are selected so that the interaction between the different lattice dimensions of the first lattice dimension III-V semiconductor layer 10 and the second lattice dimension III-V semiconductor layer 15 cause an internal compressive strain in the second lattice dimension III-V semiconductor layer 15. In one embodiment, the second lattice dimension III-V semiconductor layer 15 has a lattice dimension ranging from 5.45 Å to 6.48 Å, and the first lattice dimension III-V semiconductor layer 10 has a lattice dimension ranging from 5.45 Å to 6.48 Å, wherein the lattice dimension of the second lattice dimension III-V semiconductor layer 15 is greater than the first lattice dimension III-V semiconductor layer 10. In another embodiment, the second lattice dimension III-V semiconductor layer 15 has a lattice dimension ranging from 5.65 Å to 6.06 Å, and the first lattice dimension III-V semiconductor layer 10 has a lattice dimension ranging from 5.65 Å to 6.06 Å, wherein the lattice dimension of the second lattice dimension III-V semiconductor layer 15 is greater than the first lattice dimension III-V semiconductor layer 10. In yet another embodiment, the second lattice dimension III-V semiconductor layer 15 has a lattice dimension ranging from 5.87 Å to 6.06 Å, and the first lattice dimension III-V semiconductor layer 10 has a lattice dimension ranging from 5.65 Å to 5.87 Å, wherein the lattice dimension of the second lattice dimension III-V semiconductor layer 15 is greater than the first lattice dimension III-V semiconductor layer 10.

The compressive strain that is formed in the second lattice dimension III-V semiconductor layer 15 may be a biaxial compressive strain or a uniaxial compressive strain. By 'biaxial compressive strain" it is meant that a compressive force is induced in at least two directions of a three dimensional structure. By "uniaxial compressive strain" it is meant that a compressive force is induced in one direction of a three dimensional structure. The magnitude of the compressive strain that is produced in the second lattice dimension III-V semiconductor layer 15 may range from 500 MPa to 3000 MPa. In another embodiment, the magnitude of the compressive strain that is produced in the second lattice dimension III-V semiconductor layer 15 may range from 100 MPa to 4000 MPa. In yet another embodiment, the magnitude of the compressive strain that is produced in the second lattice dimension III-V semiconductor layer 15 may range from 1000 MPa to 2000 MPa.

In one example, the first lattice dimension III-V semiconductor layer 10 is composed of $In_yAl_{1-y}As$, wherein y is less than 0.6, and the second III-V semiconductor layer 15 is composed of $InGa_{1-x}As$, wherein x ranges from 0.4 to 0.6. For example, y may be less than 0.53 for the first III-V semiconductor layer 10 that is composed of $In_yAl_{1-y}As$. The lattice mismatch between the aforementioned first III-V semiconductor layer 10 composed of $In_yAl_{1-y}As$ and the aforementioned second III-V semiconductor layer 15 composed of $In_xGa_{1-x}As$ can provide a biaxial compressive strain in the second lattice dimension III-V semiconductor material layer 15. In one example, the biaxial compressive strain that is produced in the aforementioned second lattice dimension III-V semiconductor material layer 15 composed of $In_xGa_{1-x}As$ may range from 100 MPa to 2000 MPa.

In one example, the second lattice dimension III-V semiconductor layer 15 has a thickness ranging from 0.5 nm to 50 nm. In another example, the second lattice dimension III-V semiconductor layer 15 has a thickness ranging from 0.5 nm to 4 nm. In one example, the first lattice dimension III-V semiconductor layer 10 has a thickness ranging from 5 nm to 500 nm. In another example, the first lattice dimension III-V semiconductor layer 10 has a thickness ranging from 10 nm to 200 nm.

In the above example depicted in FIG. 1A, in which the first lattice dimension III-V semiconductor layer 10 is composed of $In_yGa_{1-y}As$, wherein y is less than 0.6, and the second lattice dimension III-V semiconductor layer 15 is composed of $In_xAl_{1-x}As$, wherein x ranges from 0.4 to 0.6, the semiconductor substrate 5 may be composed of InP. The first lattice dimension III-V semiconductor layer 10 that is composed of $In_yGa_{1-y}As$ may be in direct contact with the InP semiconductor substrate 5. It is noted that InP is only one material that is suitable for the semiconductor substrate 5 that is depicted in FIG. 1A. Other III-V compound semiconductors have been contemplated for the semiconductor substrate 5. Examples of III-V compound semiconductors that can be used in the present disclosure for the semiconductor substrate 5 include, but are not limited to, alloys of InGaAs, InAlAs, InAlAsSb, InAlAsP and InGaAsP.

Figure 1B:
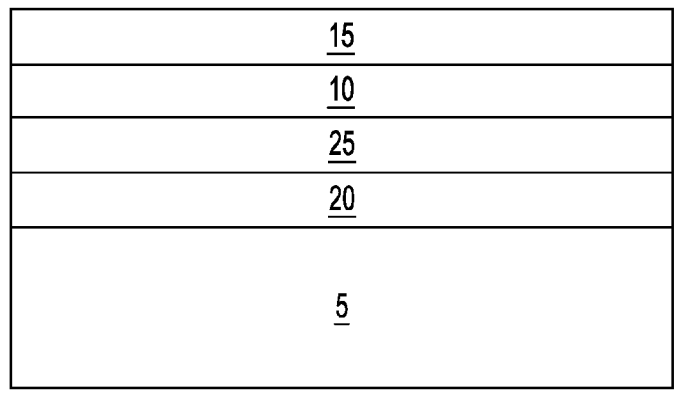
FIG. 1B is a side cross-sectional view depicting a material stack that includes a semiconductor substrate, a nucleation buffer layer that is present on the semiconductor substrate, a graded buffer layer that is present on the nucleation buffer layer, a first lattice dimension III-V semiconductor layer that is present on the graded buffer layer, and a second lattice dimension III-V semiconductor layer that is present on the first lattice dimension III-V semiconductor layer, wherein the second lattice dimension IIII-V semiconductor layer has a compressive strain present therein, in accordance with another embodiment of the present disclosure.

FIG. 1B depicts another embodiment of a material stack that can provide a compressively strained III-V semiconductor that may be suitable to provide the channel portion of a p-type semiconductor device. In this embodiment, the second lattice dimension III-V semiconductor layer 15 and the first lattice dimension III-V semiconductor layer 10 are present on and separated from the semiconductor substrate 5 by a nucleation buffer layer 20 that is present over the semiconductor substrate 5 and a graded buffer layer 25 that is present on the nucleation buffer layer 20. The nucleation buffer layer 20 and the graded buffer layer 25 provide that the lattice dimension is equal to the overlying material at the interface therebetween. The terms "present over", "overlying", "atop", "positioned on" or "present on" mean that a first element, such as a first structure, is present on a second element, such as a second structure, wherein intervening elements, such as an interface structure may be present between the first element and the second element. In one embodiment, the nucleation buffer layer 20 is present in direct contact with an upper surface of the semiconductor substrate 5, and the graded buffer layer 25 is in direct contact with on the upper surface of the nucleation buffer layer 20. Still referring to FIG. 1B, in this embodiment, the first lattice dimension III-V semiconductor layer 10 is present in direct contact with the nucleation buffer layer 20, and the second lattice dimension III-V semiconductor layer 15 is present in direct contact with the first lattice dimension III-V semiconductor layer 10.

In one embodiment, the nucleation buffer layer 20 is composed of GaAs, and the graded buffer layer 25 is composed of $In_xAl_{1-x}As$. In one example, x=0–y for the $In_xAl_{1-x}As$ buffer layer 25, wherein y may range from 0 to 1. In one embodiment, the first lattice dimension III-V semiconductor layer 10 is comprised of $In_yAl_{1-y}As$, wherein y ranges from 0 to 1, and the second lattice dimension III-V semiconductor material layer 15 is composed of $In_zGa_{1-z}As$, wherein z ranges from 0 to 1, and the x and y values both range from 0 to 1 so that the first lattice dimension III-V semiconductor layer 10 has a larger lattice constant than the second lattice dimension III-V semiconductor layer 15. The lattice mismatch between the aforementioned first lattice dimension III-V semiconductor layer 10 that is composed of $In_yAl_{1-y}As$, and the aforementioned second lattice dimension III-V semiconductor layer 15 that is composed of $In_xAl_{1-x}As$ can provide a biaxial compressive strain in the second lattice dimension III-V semiconductor layer 15. In one example, the biaxial compressive strain that is produced in the aforementioned second III-V semiconductor layer 15 composed of $In_xAl_{1-x}As$ may range from 100 MPa to 3000 MPa. In the example depicted in FIG. 1B, the semiconductor substrate 5 is composed of type IV semiconductor material, such as silicon. Other examples of materials for the semiconductor substrate 5 depicted in FIG. 1B include SiGe, SiGeC, SiC, Ge alloys, Ga, GaAs, InAs, InP, Ge and other III-V compound semiconductors.

The thickness for the first lattice dimension III-V semiconductor layer 10 and the second lattice dimension III-V semiconductor layer 15 have been described above with reference to FIG. 1A. In one example, the nucleation buffer layer 20 has a thickness ranging from 5 nm to 4000 nm. In another example, the nucleation buffer layer 20 has a thickness ranging from 10 nm to 1000 nm. In one example, the graded buffer layer 25 has a thickness ranging from 1 nm to 4000 nm. In another example, the graded buffer layer 25 has a thickness ranging from 100 nm to 1000 nm.

Each of the material layers that are depicted in FIGS. 1A and 1B, i.e., the nucleation buffer layer 20, the graded buffer layer 25, the first lattice dimension III-V semiconductor layer 10 and the second lattice dimension III-V semiconductor layer 15, may be formed, i.e., deposited, using an epitaxial deposition method. The terms "epitaxially formed", "epitaxial growth" and/or "epitaxial deposition" mean the growth of a semiconductor material on a deposition surface of a semiconductor material, in which the semiconductor material being grown has the same crystalline characteristics as the semiconductor material of the deposition surface. Therefore, in the embodiments in which the deposition surface has a single crystal crystalline structure, the epitaxially grown material layer also has a single crystal crystalline structure.

Some examples of epitaxial growth process for forming the nucleation buffer layer 20, the graded buffer layer 25, the first lattice dimension III-V semiconductor layer 10 and the second lattice dimension III-V semiconductor layer 15 include molecular beam epitaxy (MBE) or metal-organo chemical vapor deposition (MOCVD). In some embodiments, each of the III-V semiconductor layers are formed by an epitaxial growth process that produces a high quality, single crystal III-V film. The deposition of each of the III-V compound semiconductor layers of the present disclosure may be performed in the same or different apparatus. Moreover, each of the epitaxially deposited layers can be formed without breaking vacuum during the deposition of each of the layers. Alternatively, vacuum may be broken during the formation of an individual III-V semiconductor layer.

The III-V compound semiconductors are epitaxially grown utilizing III-V-containing precursors. One example of an arsenic-containing precursor for providing the arsenic element of the epitaxially deposited layer is arsine ($AsH_3$) gas. One example of a gallium-containing precursor for providing the gallium element of the epitaxially deposited layer is Tri-methyl-gallium (TMG). One example of an indium-containing precursor for providing the indium element of the epitaxially deposited layer is Tri-methyl-Indium (TMI). One example of an aluminum (Al) containing precursor for providing the aluminum element of the epitaxially deposited layer is Tri-methyl-Aluminum (TMA). When the vacuum between the deposition of each of the III-V layers is not broken, the precursors can be switched to provide the next layer.

The material stacks depicted in FIGS. 1A and 1B are only two examples of material stacks that are suitable for use with the present disclosure. Other compositions for the first lattice dimension III-V semiconductor layer 10 and the second lattice dimension III-V semiconductor layer 15 are suitable for use with the present disclosure, so long as the second lattice dimension III-V semiconductor layer 15 has a compressive strain present therein.

Figure 2:
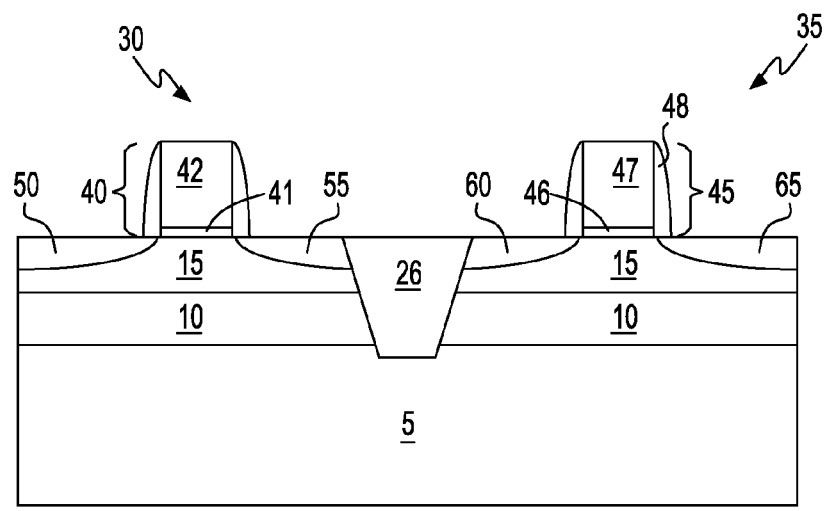
FIG. 2 is a side cross-sectional view depicting one embodiment of a p-type field effect transistor on a first portion of the second lattice dimension III-V semiconductor layer having the compressive strain present therein, and an n-type field effect transistor on a second portion of the second lattice dimension III-V semiconductor layer.
Figure 3:
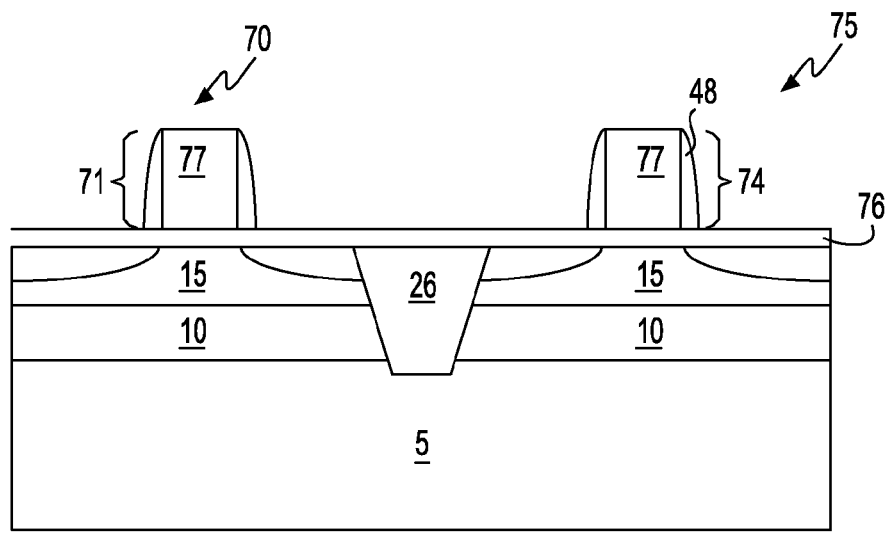
FIG. 3 is a side cross-sectional view depicting one embodiment of a p-type high electron mobility transistor (HEMT) on a first portion of the second lattice dimension III-V semiconductor layer having the compressive strain present therein, and an n-type high electron mobility transistor (HEMT) on a second portion of the second lattice dimension III-V semiconductor layer.
Figure 4:
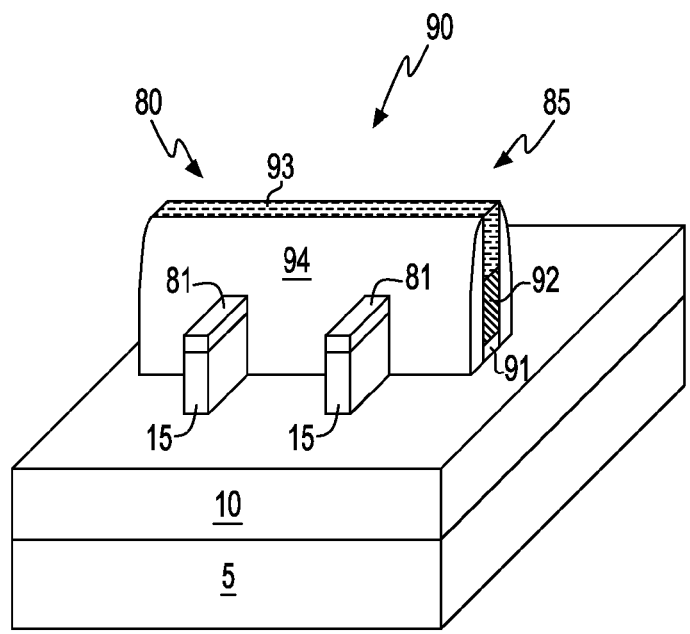
FIG. 4 is a side cross-sectional view depicting one embodiment of a p-type fin field effect transistor on a first portion of the second lattice dimension III-V semiconductor layer having the compressive strain present therein, and an n-type fin field effect transistor on a second portion of the second lattice dimension III-V semiconductor layer.

The material stacks depicted in FIGS. 1A and 1B may be used to provide the base materials, i.e., substrate, for forming semiconductor devices, such as field effect transistors, high electron mobility transistor (HEMT), and fin field effect transistors, as depicted in FIGS. 2-4. Although FIGS. 2-4 depict the material stack that is illustrated in FIG. 1A, the material stack that is depicted in FIG. 1B is equally suitable for providing the substrate for the semiconductor devices depicted in FIGS. 2-4.

FIG. 2 depicts one embodiment of a p-type field effect transistor 30 on a first portion of the second lattice dimension III-V semiconductor layer 15 having the compressive strain present therein, and an n-type field effect transistor 35 on a second portion of the second lattice dimension III-V semiconductor layer 15. As used herein a "field effect transistor" is a transistor in which output current, i.e., source-drain current, is controlled by the voltage applied to a gate structure. A field effect transistor has three terminals, i.e., a gate structure, source region and drain region. As used herein, the term "source" is a doped region in the field effect transistor, in which majority carriers are flowing into the channel. As used herein, the term "drain" means a doped region in the field effect transistor located at the end of the channel, in which carriers are flowing out of the transistor through the drain. The gate structure controls the output current (i.e., flow of carriers in the channel) of the semiconducting device through electrical or magnetic fields. In a field effect transistor, the gate structure includes at least one gate dielectric layer that is present between a gate conductor and the semiconductor substrate 5, e.g., the channel portion of the second lattice dimension III-V semiconductor layer 15. In FIG. 2, the field effect transistors are planar devices. The term "planar" as used to describe a semiconductor device, a field effect transistor denotes that the direction of charge carriers from the source region to the drain region of the semiconductor device is along a plane that is parallel to the upper surface of the substrate, wherein the gate structure is present on the upper surface of the substrate. Typically, in a planar device at least a portion of the source region and the drain region are present within the upper surface of the substrate.

In one embodiment, a complementary metal oxide semiconductor (CMOS) device may be provided by employing a first conductivity semiconductor device, such as a p-type field effect transistor 30, on a first portion of the second lattice dimension III-V semiconductor layer 15 and a second conductivity device, such as an n-type field effect transistor 35, that is present on a second portion of the second lattice dimension III-V semiconductor layer 15. The term "conductivity type" denotes whether the semiconductor device 30, 35 has a p-type or n-type conductivity, i.e., whether the source regions 50, 60 and drain regions 55, 65 of the semiconductor device 30, 35 have an n-type or p-type conductivity.

Referring to FIG. 2, in one embodiment, the p-type field effect transistor 30 on a first portion of the second lattice dimension III-V semiconductor layer 15 may include a first gate structure 40, a p-type source region 50, and a p-type drain region 55. The n-type field effect transistor 35 that is present on the second portion of the second lattice dimensions III-V semiconductor layer 15 may include a second gate structure 45, an n-type source region 60 and an n-type drain region 65.

The p-type field effect transistor 30 may be separated from the n-type field effect transistor 35 by an isolation region 26. The isolation region 26 may be composed of any dielectric material, such as oxides, nitrides or oxynitride dielectrics. For example, the isolation region 26 may be composed of silicon oxide ($SiO_2$) or silicon nitride. In one embodiment, the isolation region 26 is formed by forming a trench through at least the second lattice dimension III-V semiconductor layer 15 utilizing a dry etching process, such as reactive-ion etching or plasma etching, and then filling the trench with an insulating material, such as an oxide, e.g., silicon oxide ($SiO_2$).

The first gate structure 40 of the p-type field effect transistor 30 and second gate structure 45 of the n-type field effect transistor 35 may each include at least one gate dielectric 41, 46 and at least one gate conductor 42, 47. The at least one gate dielectric 41, 42 may comprise dielectric materials such as oxides, nitrides and oxynitrides of silicon that have a dielectric constant from about 4 (i.e., typically a silicon oxide) to about 8, (i.e., typically a silicon nitride) measured in vacuum at room temperature (20° C. to 25° C.). Alternatively, the gate dielectrics 41, 46 may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The at least one gate dielectric 41, 46 may be formed using any of several methods that are appropriate to their material(s) of composition. Non limiting examples include thermal or plasma oxidation or nitridation methods, chemical vapor deposition methods (including atomic layer deposition methods) and physical vapor deposition methods.

The at least one gate conductor 42, 47 may comprise materials including, but not limited to metals, metal alloys, metal nitrides and metal silicides, as well as laminates thereof and composites thereof. The at least one gate conductor 42, 47 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods. Typically, each of the at least one gate conductor 42, 47 comprises a doped polysilicon material that has a thickness from about 400 to about 2000 angstroms.

In some embodiments, the first gate structure 40 and the second gate structure 45 may be formed by blanket depositing the material layers for the at least one gate dielectric 41, 46, and the at least one gate conductor 42, 47 to provide a gate stack, wherein the gate stack is patterned and etched to provide the first gate structure 40 and the second gate structure 45. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. Alternatively, the first and second gate structure 40, 45 can be formed by replacement gate technology.

In some embodiments, following formation of the first gate structure 40 and the second gate structure 45, at least one gate sidewall spacer 48 may be formed adjacent to the gate structures 40, 45. The gate sidewall spacer 48 may comprise dielectric materials, and in some embodiments, the gate sidewall spacer 48 may comprise generally lower dielectric constant dielectric materials that have a dielectric constant less than about 4. The gate sidewall spacers 48 may also be formed with a distinctive inward pointing spacer shape by using a blanket layer deposition and anisotropic etchback method. In one example, the gate sidewall spacer 48 is composed of a combination of silicon oxide and silicon nitride dielectric materials.

Still referring to FIG. 2, p-type conductivity source and drain regions 50, 55 are formed in the second lattice dimension III-V semiconductor layer 15 for the p-type field effect transistor 30, and n-type conductivity source and drain regions 60, 65 are formed in the second lattice dimension III-V semiconductor layer 15 for the n-type field effect transistor 35. For the type III-V semiconductor material that provides the second lattice dimension III-V semiconductor layer 15, the effect of the dopant atom, i.e., whether it is a p-type or n-type dopant, depends upon the site occupied by the dopant atom on the lattice of the base material. In a type III-V semiconductor, atoms from group II act as acceptors, i.e., p-type, when occupying the site of a group III atom, while atoms in group VI act as donors, i.e., n-type, when they replace atoms from group V. Dopant atoms from group IV, such as silicon (Si), have the property that they can act as acceptors or donor depending on whether they occupy the site of group III or group V atoms respectively. Such impurities are known as amphoteric impurities. The dopant concentration for the dopant that dictates the conductivity type of the type III-V semiconductor material that provides the emitter layer 20 may range from $10^{15}$ atoms/cm$^3$ to $10^{21}$ atoms/cm$^3$. In another embodiment, the dopant concentration that dictates the conductivity type of the type III-V semiconductor material ranges from $10^{16}$ atoms/cm$^3$ to $10^{20}$ atoms/cm$^3$.

Selective processing for providing p-type field effect transistor 30 and the n-type field effect transistor 35 having source regions 50, 60 and drain regions 55, 65 with different conductivity dopant may be provided by using a block mask. The block masks that are used to allow for independent processing of the first portion of the second lattice dimension III-V semiconductor layer 15 in which the p-type field effect transistor 30 is formed, and the second portion of the second lattice dimension III-V semiconductor layer 15 in which the n-type field effect transistor 35 is formed, may be composed of soft and/or hardmask materials and can be formed using deposition, photolithography and etching.

The compressive strain, e.g., biaxial compressive strain, that is present in the second lattice dimension III-V semiconductor layer 15 increases the carrier mobility, i.e., hole mobility, for the p-type field effect transistor 30 within the range of 5% to 20%, when compared to the carrier mobility, i.e., hole mobility, for p-type field effect transistors having a channel that is not compressively strained. In another example, the compressive strain that is present in the second lattice dimension III-V semiconductor layer 15 increase the carrier mobility, i.e., hole mobility, for the p-type field effect transistor 30 within the range of 10% to 15%, when compared to the carrier mobility, i.e., hole mobility, for p-type field effect transistors having a channel that is not compressively strained. In one example, the compressive strain that is present in the second lattice dimension III-V semiconductor layer 15 increases the carrier mobility, i.e., hole mobility, for the p-type field effect transistor 30 by 12%, when compared to the carrier mobility, i.e., hole mobility, for p-type field effect transistors having a channel that is not compressively strained.

The compressive strain is also present in the channel portion of the second lattice dimension III-V semiconductor layer 15 for the n-type field effect transistor 35, but the compressive strain has a negligible effect on the carrier mobility, i.e., electron mobility. In one embodiment, the compressive strain that is present in the second lattice dimension III-V semiconductor layer 15 only decreases the carrier mobility, i.e., electron mobility, for the n-type field effect transistor 35 by less than 0.5%, when compared to the carrier mobility, i.e., electron mobility, for n-type field effect transistors having a channel that is not compressively strained. In another embodiment, the compressive strain that is present in the second lattice dimension III-V semiconductor layer 15 only decreases the carrier mobility, i.e., electron mobility, for the n-type field effect transistor 35 by less than 0.25%, when compared to the carrier mobility, i.e., electron mobility, for n-type field effect transistors having a channel that is not compressively strained. In one example, the compressive strain that is present in the second lattice dimension III-V semiconductor layer 15 only decreases the carrier mobility, i.e., electron mobility, for the n-type field effect transistor 35 by less than 0.1%, when compared to the carrier mobility, i.e., electron mobility, for n-type field effect transistors having a channel that is not compressively strained.

FIG. 3 depicts one embodiment of a p-type high electron mobility transistor (HEMT) 70 on a first portion of the second lattice dimension III-V semiconductor layer 15 having the compressive strain present therein, and an n-type high electron mobility transistor (HEMT) 75 on a second portion of the second lattice dimension III-V semiconductor layer 15. A high electron mobility transistor (HEMT) is a transistor incorporating a junction between two materials with different band gaps (i.e., a heterojunction) as the channel instead of a doped region, as is generally the case for field effect transistors, where carriers are confined in the material within the lower bandgap. The term "band gap" refers to the energy difference between the top of the valence band (i.e., $E_v$) and the bottom of the conduction band (i.e., $E_c$) of a material. The semiconductor substrate 5, the first lattice dimension III-V semiconductor layer 10, the second lattice dimension III-V semiconductor layer 15, the isolation region 26, the source regions 50, 60, the at least are gate sidewall spacer 48 and the drain regions 55, 60 that are depicted in FIG. 3 are similar to the semiconductor substrate 5, the first lattice dimension III-V semiconductor layer 10, the second lattice dimension III-V semiconductor layer 15, the isolation region 26, the source regions 50, 60, the at least are gate sidewall spacer 48 and the drain regions 55, 60 that have been described above with reference to FIG. 2. Therefore, the above description of the semiconductor substrate 5, the first lattice dimension III-V semiconductor layer 10, the second lattice dimension III-V semiconductor layer 15, the isolation region 26, the source regions 50, 60, the at least are gate sidewall spacer 48 and the drain regions 55, 60 that are depicted in FIG. 2, are suitable for the semiconductor substrate 5, the first lattice dimension III-V semiconductor layer 10, the second lattice dimension III-V semiconductor layer 15, the isolation region 26, the source regions 50, 60, the at least are gate sidewall spacer 48 and the drain regions 55, 60 that are depicted in FIG. 3.

One difference between the p-type high electron mobility transistor (HEMT) 70 and the n-type high electron mobility transistor (HEMT) 75 that are depicted in FIG. 3 and the p-type field effect transistor 30 and the n-type field effect transistor 35 depicted in FIG. 2 is the gate structures 40, 45, 71, 74 for the devices. In the field effect transistors 30, 35, the gate structures 40, 45 each include at least one gate dielectric 41, 46. In the p-type high electron mobility transistor (HEMT) 70 and the n-type high electron mobility transistor (HEMT) 75 the gate structures 71, 74 do not include a gate dielectric. Instead, in place of the gate dielectrics typically employed in field effect transistors, the gate structures 71, 74 include a semiconductor junction material 76 in direct contact with and having a different band gap than the second lattice dimension III-V semiconductor layer 15.

The semiconductor junction material 76 that is in direct contact with and having a different band gap than the second lattice dimension III-V semiconductor material layer 15 is typically composed of a III-V compound semiconductor material. In one embodiment, when the second lattice dimension III-V semiconductor layer 15 is composed of $In_zGa_{1-z}As$, the semiconductor junction material 76 is composed of $In_yAl_{1-y}As$. Other examples of compositions for the semiconductor junction material 76 include alloys of InGaAs, InAlAs, InAlAsSb, InAlAsP and InGaAsP. The semiconductor junction material 76 may be deposited using chemical vapor deposition and/or physical vapor deposition, and may have a thickness ranging from 0.3 nm to 15 nm. The gate conductor 77 for the gate structures 71, 74 includes any conductive material such as, for example, polysilicon, polysilicon germanium, conductive metals, conductive metal alloys, conductive silicides, conductive nitrides and combinations or multi-layers thereof.

The compressive strain, e.g., biaxial compressive strain, that is present in the second lattice dimension III-V semiconductor layer 15 can increase the carrier mobility, i.e., hole mobility, for the p-type high electron mobility transistor (HEMT) 70 within the range of 5% to 20%, when compared to the carrier mobility, i.e., hole mobility, for p-type high electron mobility transistors (HEMT) having a channel that is not compressively strained. In another example, the compressive strain that is present in the second lattice dimension III-V semiconductor layer 15 increase the carrier mobility, i.e., hole mobility, for the p-type high electron mobility transistor (HEMT) 70 within the range of 10% to 15%, when compared to the carrier mobility, i.e., hole mobility, for p-type high electron mobility transistors (HEMT) having a channel that is not compressively strained. In one example, the compressive strain that is present in the second lattice dimension III-V semiconductor layer can increase the carrier mobility, i.e., hole mobility, for the p-type high electron mobility transistor (HEMT) 70 by 12%, when compared to the carrier mobility, i.e., hole mobility, for p-type high electron mobility transistors (HEMT) having a channel that is not compressively strained.

The compressive strain is also present in the channel portion of the second lattice dimension III-V semiconductor layer 15 for the n-type high electron mobility transistor (HEMT) 75, but the compressive strain has a negligible effect on the carrier mobility, i.e., electron mobility. In one embodiment, the compressive strain that is present in the second lattice dimension III-V semiconductor layer 15 only decreases the carrier mobility, i.e., electron mobility, for the n-type high electron mobility transistor (HEMT) 75 by less than 0.5%, when compared to the carrier mobility, i.e., electron mobility, for n-type high electron mobility transistors (HEMT) having a channel that is not compressively strained. In one example, the compressive strain that is present in the second lattice dimension III-V semiconductor layer 15 only decreases the carrier mobility, i.e., electron mobility, for the n-type high electron mobility transistors (HEMT) 75 by less than 0.1%, when compared to the carrier mobility, i.e., electron mobility, for n-type high electron mobility transistors (HEMT) 75 having a channel that is not compressively strained.

FIG. 4 depicts one embodiment of a p-type fin field effect transistor 80 having a fin structure composed of the second lattice dimension III-V semiconductor layer 15 having the compressive strain present therein, and an n-type fin field effect transistor 85 also having a fin structure composed of the second lattice dimension III-V semiconductor layer 15. As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A fin field effect transistor is a field effect transistor that uses a fin structure for at least the channel portion of the semiconductor device. The fin structures may be formed by etching the material stack composed of the second lattice dimension III-V semiconductor layer 15 and the first lattice dimension III-V semiconductor layer 10. In one embodiment, prior to etching the material stack to provide the fin structures, a layer of the dielectric material that provides a dielectric fin cap 81 is deposited atop the second lattice dimension III-V semiconductor layer 15. The dielectric fin cap 81 may be composed of a nitride, oxide, oxynitride material, and/or any other suitable dielectric layer. The dielectric fin cap 81 can be formed by a deposition process, such as chemical vapor deposition and/or atomic layer deposition. In one embodiment, following the formation of the layer of dielectric material that provides the dielectric fin cap 81, a photolithography and etch process sequence applied to the dielectric fin cap 81 and the second lattice dimension III-V semiconductor layer 15 may provide the fin structures. The etch process may remove the exposed portions of the second lattice dimension III-V semiconductor layer 15 selective to the first lattice dimension III-V semiconductor layer 10.

In the embodiment depicted in FIG. 4, one fin structure is provided for the p-type fin field effect transistor 80 and one fin structure is provided for the n-type fin field effect transistor 85. It is noted that the present disclosure is not intended to be limited to only this embodiment, as any number of fin structures may be provided for the p-type fin field effect transistor 80 and the n-type fin field effect transistor 85. In one embodiment, each fin structure may have a height ranging from 5 nm to 200 nm, and a width of less than 20 nm. In another embodiment, each fin structure has a height ranging from 10 nm to 100 nm, and a width ranging from 3 nm to 8 nm.

Following formation of the fin structures, a gate structure 90 may be formed on the channel portion for the fin structure including the first portion of the second lattice dimension III-V semiconductor layer 15 for the p-type fin field effect transistor 80 and the channel portion of the fin structure including the second portion of the second lattice dimension III-V semiconductor layer 15 for the n-type fin field effect transistor 85. Although the gate structure 90 depicted in FIG. 4 is a shared gate structure 90 for both the p-type fin field effect transistor 80 and the n-type fin field effect transistor 85, the present disclosure is not limited to only this embodiment, because a separate gate structure may be provided for each of the p-type fin field effect transistor 80 and the n-type fin field effect transistor 85. The gate structure 90 for the p-type fin field effect transistor 80 and the n-type fin field effect transistor 85 is similar to the gate structures 40, 45 for the planar field effect transistors 30, 35 that are depicted in FIG. 2. For example, the gate structure 90 for the fin field effect transistors includes at least one gate dielectric layer 91 and at least one gate conductor 92. The at least one gate dielectric layer 91 and the at least one gate conductor 92 that are depicted in FIG. 4 are similar to the at least one gate dielectric 41, 46 and the at least one gate conductor 42, 47 that are depicted in FIG. 2. Therefore, the description of the at least one gate dielectric 41, 46 and the at least one gate conductor 42, 47 that are depicted in FIG. 2 is suitable for the at least one gate dielectric layer 91 and the at least one gate conductor 92 that are depicted in FIG. 4. The gate structure 90 may further include a gate dielectric cap 93 that is present on top of the at least one gate conductor 92.

Following the formation of the gate structure 90, gate sidewall spacers 94 may be formed adjacent to the gates structure 90, and source and drain regions may be formed in the portions of the fin structure that are on opposing sides of the channel portion of the fin structures. The source and drain regions for the p-type fin field effect transistor 80 and the n-type fin field effect transistor 85 that are depicted in FIG. 4 are similar to the source and drain regions 50, 60, 55, 65 of the planar field effect transistors that are depicted in FIG. 2. Therefore, the above description of the source and drain regions 50, 60, 55, 65 of the planar field effect transistors that are depicted in FIG. 2 is suitable for the source and drain regions for the p-type fin field effect transistor 80 and the n-type fin field effect transistor 85.

The second lattice dimension III-V semiconductor material layer 15 that provides the fin structure for the p-type fin field effect transistor 80 is under a compressive strain, e.g., uniaxial compressive strain. The compressive strain that is present in the second lattice dimension III-V semiconductor layer 15 can increase the carrier mobility, i.e., hole mobility, for the p-type fin field effect transistor 80 within the range of 5% to 20%, when compared to the carrier mobility, i.e., hole mobility, for the p-type fin field effect transistors having a channel that is not compressively strained. In another example, the compressive strain that is present in the second lattice dimension III-V semiconductor layer 15 can increase the carrier mobility, i.e., hole mobility, for p-type fin field effect transistor 80 within the range of 10% to 15%, when compared to the carrier mobility, i.e., hole mobility, for p-type fin field effect transistors having a channel that is not compressively strained. In one example, the compressive strain that is present in the second lattice dimension III-V semiconductor layer 15 can increase the carrier mobility, i.e., hole mobility, for the p-type fin field effect transistor 80 by 12%, when compared to the carrier mobility, i.e., hole mobility, for p-type fin field effect transistors having a channel that is not compressively strained.

The compressive strain is also present in the channel portion of the second lattice dimension III-V semiconductor layer 15 for the n-type fin field effect transistor 85, but the compressive strain has a negligible effect on the carrier mobility, i.e., electron mobility. In one embodiment, the compressive strain that is present in the second lattice dimension III-V semiconductor layer 15 only decreases the carrier mobility, i.e., electron mobility, for the n-type fin field effect transistor 85 by less than 0.5%, when compared to the carrier mobility, i.e., electron mobility, for n-type fin field effect transistors having a channel that is not compressively strained. In one example, the compressive strain that is present in the second lattice dimension III-V semiconductor layer 15 only decreases the carrier mobility, i.e., electron mobility, for the n-type fin field effect transistor 85 by less than 0.1%, when compared to the carrier mobility, i.e., electron mobility, for n-type fin field effect transistors having a channel that is not compressively strained.

While the structures and methods of the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
a first lattice dimension III-V semiconductor layer present atop a semiconductor substrate, and a second lattice dimension III-V semiconductor layer present on the first lattice dimension III-V semiconductor layer, wherein the second lattice dimension III-V semiconductor layer has a greater lattice dimension than the first lattice dimension III-V semiconductor layer, and the second lattice dimension IIII-V semiconductor layer has a compressive strain present therein;
a first gate structure for a p-type conductivity semiconductor device and comprising a gate dielectric having a bottommost surface present entirely on, and directly contacting, a surface of a first channel portion of the second lattice dimension III-V semiconductor layer, wherein the first channel portion of second lattice dimension III-V semiconductor layer has the compressive strain; and
a second gate structure for an n-type conductivity semiconductor device is present on a second channel portion of the second lattice dimension III-V semiconductor layer.

2. The semiconductor device of claim 1, wherein a first lattice dimension for the first lattice dimension III-V semiconductor layer ranges from 5.48 Å to 6.48 Å, and a second lattice dimension for the second lattice dimension III-V semiconductor layer ranges from 5.48 Å to 6.48 Å.

3. The semiconductor device of claim 1, wherein the first lattice dimension III-V semiconductor layer comprises $In_yAl_{1-y}As$, wherein y ranges from 0 to 1, and the second lattice dimension III-V semiconductor layer comprises $In_zGa_{1-z}As$, wherein z ranges from 0 to 1.

4. The semiconductor device of claim 1, wherein the p-type conductivity semiconductor device is a p-type field effect transistor.

5. The semiconductor device of claim 4, wherein the first gate structure further includes at least one gate conductor on said gate dielectric, and a source region and a drain region of the p-type conductivity semiconductor device are doped to a p-type conductivity.

6. The semiconductor device of claim 1, wherein the p-type conductivity semiconductor device is a p-type fin field effect transistor (p-type finFET) and at least the second lattice dimension III-V semiconductor layer is a fin structure.

7. The semiconductor device of claim 6, wherein a source region and a drain region that are present on opposing sides of the first gate structure are doped to a p-type conductivity.

8. The semiconductor device of claim 1, wherein the n-type conductivity semiconductor device is a n-type fin field effect transistor and at least the second lattice dimension III-V semiconductor layer is a fin structure.

9. The semiconductor device of claim 8, wherein the second gate structure includes at least one gate conductor on at least one gate dielectric, and a source region and a drain region of the n-type field effect transistor are doped to a n-type conductivity.

10. The semiconductor device of claim 1, further comprising:
   a nucleation buffer layer located on a surface of a semiconductor substrate; and
   a graded buffer layer located on a surface of the nucleation buffer layer, wherein the first lattice dimension III-V semiconductor layer is located on the graded buffer layer.

11. The semiconductor device of claim 10, wherein the nucleation buffer layer comprises GaAs.

12. The semiconductor device of claim 11, wherein the graded buffer layer is an InAlAs compound.

* * * * *